United States Patent
Chikano et al.

(10) Patent No.: US 10,014,609 B2
(45) Date of Patent: Jul. 3, 2018

(54) CONNECTOR

(71) Applicant: Molex, LLC, Lisle (IL)

(72) Inventors: Koji Chikano, Setagaya (JP); Makiko Ikeda, Yamato (JP); Kazushige Asakawa, Yokohama (JP)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 15/802,830

(22) Filed: Nov. 3, 2017

(65) Prior Publication Data

US 2018/0151969 A1 May 31, 2018

Related U.S. Application Data

(60) Provisional application No. 62/426,868, filed on Nov. 28, 2016.

(30) Foreign Application Priority Data

Apr. 19, 2017 (JP) ................. 2017-082968

(51) Int. Cl.
| | |
|---|---|
| *H01R 12/00* | (2006.01) |
| *H01R 12/73* | (2011.01) |
| *H01R 12/71* | (2011.01) |
| *H01R 13/436* | (2006.01) |
| *H01R 12/70* | (2011.01) |

(Continued)

(52) U.S. Cl.
CPC .......... *H01R 12/716* (2013.01); *H01R 12/52* (2013.01); *H01R 12/707* (2013.01); *H01R 12/724* (2013.01); *H01R 13/26* (2013.01); *H01R 13/4361* (2013.01); *H01R 13/4223* (2013.01);

(Continued)

(58) Field of Classification Search
CPC .. H01R 12/716; H01R 23/725; H01R 13/115; H01R 12/57
See application file for complete search history.

(56) References Cited

U.S. PATENT DOCUMENTS

| 7,901,218 B2* | 3/2011 | Sato ..................... H01R 12/716 439/74 |
|---|---|---|
| 9,728,882 B1* | 8/2017 | Nakazawa ........... H01R 12/716 |

(Continued)

FOREIGN PATENT DOCUMENTS

| JP | S61-214545 A | 9/1986 |
|---|---|---|
| JP | 2951102 B2 | 9/1999 |

(Continued)

*Primary Examiner* — Briggitte R Hammond
(74) *Attorney, Agent, or Firm* — Bo Huang

(57) ABSTRACT

A connector is provided that has a terminal, a housing for retaining the terminal, and a reinforcing bracket retained in the housing. The housing includes a fitting concave portion that fits with a counterpart connector and a bottom plate portion that faces a surface of a substrate. The terminal includes a contact portion that makes contact with a counterpart terminal of the counterpart connector inside the fitting concave portion and a substrate connecting portion exposed from a lower surface of the bottom plate portion and connected to a connecting pad on the surface of the substrate. The reinforcing bracket includes a main body portion retained in the housing inside the fitting concave portion and a leg portion exposed from the lower surface of the bottom plate portion and connected to the connecting pad on the surface of the substrate.

6 Claims, 15 Drawing Sheets

(51) Int. Cl.
*H01R 12/72* (2011.01)
*H01R 13/26* (2006.01)
*H01R 12/52* (2011.01)
H05K 3/36 (2006.01)
*H01R 13/422* (2006.01)

(52) U.S. Cl.
CPC ... *H05K 3/368* (2013.01); *H05K 2201/10189* (2013.01)

(56) References Cited

U.S. PATENT DOCUMENTS

| | | | | |
|---|---|---|---|---|
| 2009/0305528 | A1* | 12/2009 | Hirata | H01R 12/716 439/74 |
| 2015/0038018 | A1* | 2/2015 | Matsuzawa | H01R 12/716 439/638 |
| 2016/0172780 | A1* | 6/2016 | Tamai | H01R 12/73 439/733.1 |

FOREIGN PATENT DOCUMENTS

| | | | |
|---|---|---|---|
| JP | 3204633 | B2 | 9/2001 |
| JP | 3287310 | B2 | 6/2002 |
| JP | 2007-259590 | A | 10/2007 |

* cited by examiner

CONNECTOR

RELATED APPLICATIONS

This application claims priority to U.S. Patent Application No. 62/426,868, filed Nov. 28, 2016 and Japanese Application No. 2017-082968, filed Apr. 19, 2017, both of which are incorporated herein by reference in their entireties.

TECHNICAL FIELD

The present disclosure relates to a connector.

BACKGROUND ART

Conventionally, in a connector mounted on a substrate, such as a circuit board, and the like, a connector case sandwiches the connector from both sides to prevent the application of large loads on solder used to secure and connect a terminal to the substrate when external force, and the like, is received (for example, see Patent Document 1).

FIG. 15 is a perspective view illustrating a conventional connector.

In the figure, 811 is a connector upper case, and 841 is a connector lower case. A fitting concave portion 813 into which a counterpart connector not illustrated in the figure fits is formed in the upper case 811, and a plurality of terminals 851 are arranged inside the fitting concave portion 813. A retaining hole 814 is formed in a bottom portion 812 of the fitting concave portion 813, and a retaining frame 815 is inserted and fitted inside the retaining hole 814 from below. Furthermore, the terminals 851 are retained by the retaining frame 815, and tail portions 852 thereof are secured using solder to a wiring pattern of a substrate 891. Note that the substrate 891 is sandwiched from above and below by the upper case 811 and the lower case 841 such that a connector is reliably secured to the substrate 891, which thus prevents a load from being applied to the solder securing the tail portions 852 to the wiring pattern of the substrate 891, even if external force is applied.

Patent Document 1 Japanese Unexamined Patent Application Publication No. 2007-259590

SUMMARY

However, because the substrate 891 is being sandwiched from above and below by the upper case 811 and the lower case 841 in the conventional connector, the structure of the connector becomes more complex as the connector becomes larger. Furthermore, the connector can only be used in an environment where there is a space below the substrate 891 large enough to house the lower case 841.

Thus, an object is to provide a connector that solves the problems of the conventional connector, has a small and simple configuration, and can reliably sustain a connection between a substrate connecting portion of a terminal and a connecting pad of a substrate.

Therefore, a connector is provided with a terminal, a housing for retaining the terminal, and a reinforcing bracket retained in the housing, where the housing includes a fitting concave portion that fits with a counterpart connector and a bottom plate portion that faces a surface of a substrate, the terminal includes a contact portion that makes contact with a counterpart terminal of the counterpart connector inside the fitting concave portion and a substrate connecting portion exposed from a lower surface of the bottom plate portion and connected to a connecting pad on the surface of the substrate, and the reinforcing bracket includes a main body portion retained in the housing inside the fitting concave portion and a leg portion exposed from the lower surface of the bottom plate portion and connected to the connecting pad on the surface of the substrate.

Furthermore, in another connector, the terminal includes a bent portion linked to the substrate connecting portion, a lower surface of the substrate connecting portion is substantially parallel to the surface of the substrate, a tip thereof extends so as to face outward in a short direction of the housing, and a lower edge of the leg portion of the reinforcing bracket is connected to the connecting pad on the surface of the substrate in a position close to the bent portion of the terminal.

Furthermore, in yet another connector, the housing includes a reinforcing bracket retaining portion for retaining the reinforcing bracket inside the fitting concave portion, and the contact portion of the terminal extends in a fitting direction with respect to the counterpart connector along a side surface of the reinforcing bracket retaining portion.

Furthermore, in yet another connector, there is a plurality of the terminals, the contact portions are arrayed so as to form rows along each of both side surfaces of the reinforcing bracket retaining portion, the substrate connection portions are arrayed so as to form two rows on a lower surface of the bottom plate portion, and the leg portion of the reinforcing bracket is positioned between the rows of the substrate connecting portions.

Furthermore, in yet another connector, a space between the bottom plate portion and a substrate is filled with a filler.

Furthermore, in yet another connector, a groove shaped concave portion, extending in a lengthwise direction of the housing and having an opening on each end, is formed on the lower surface of the bottom plate part.

According to the present disclosure, even a small connector with a simple configuration can reliably sustain a connection between a substrate connecting portion of a terminal and a connecting pad of a substrate.

DETAILED DESCRIPTION OF THE PREFERRED EMBODIMENTS

The embodiments will be described in detail below with reference to the drawings.

Figure 1:
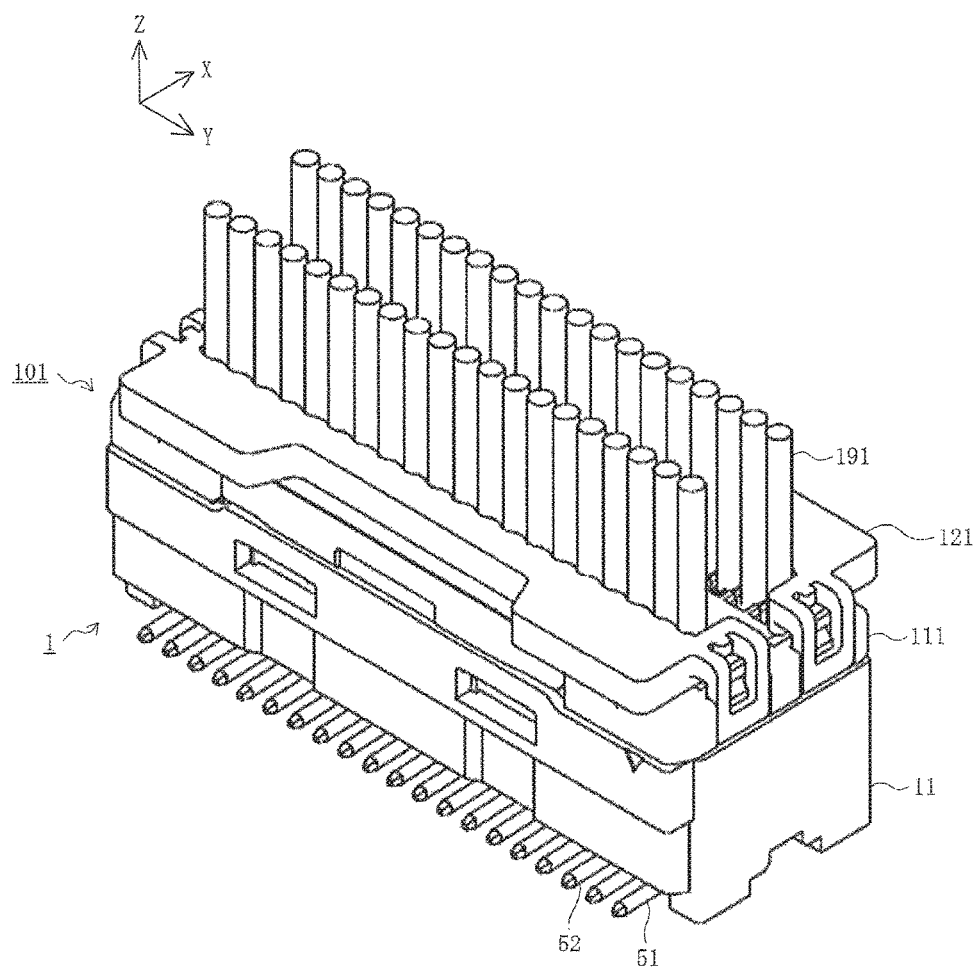
FIG. 1 is a perspective view illustrating a state where a substrate connector is fitted with a wire connector in a first embodiment.
Figure 2:
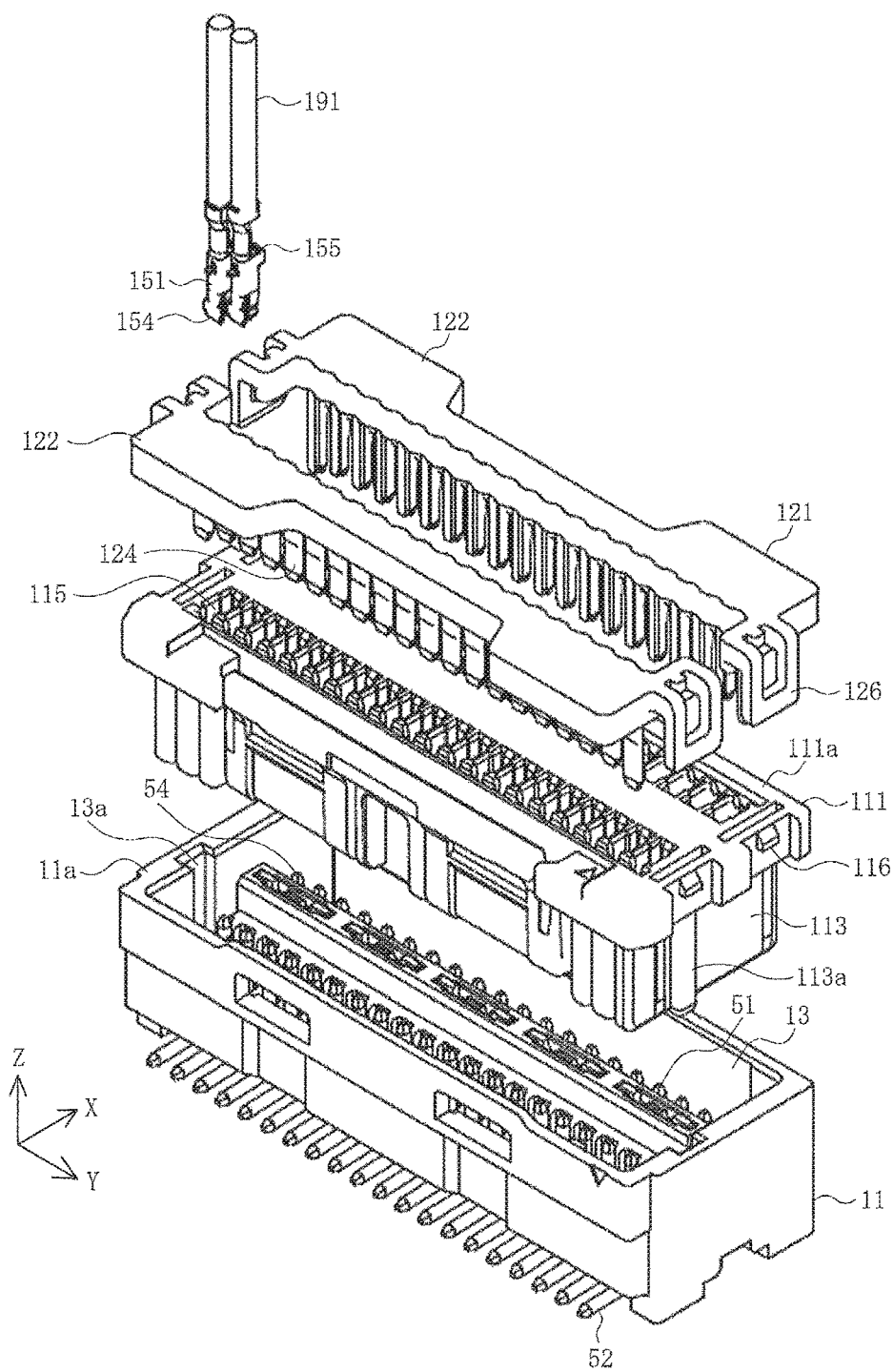
FIG. 2 is an exploded view of the wire connector in a state prior to being fitted with the substrate connector in the first embodiment.

FIG. 1 is a perspective view illustrating a state where a substrate connector is fitted with a wire connector in a first embodiment, and FIG. 2 is an exploded view of the wire connector in a state prior to being fitted with the substrate connector in the first embodiment.

In the figures, 1 is a substrate connector that serves as a connector in the present embodiment, and is a connector that mounts to a surface 91a of a substrate 91 of a circuit board, and the like, to be described later. Furthermore, 101 is a wire connector that serves as a counterpart connector in the present embodiment, and is a connector that connects to termini of a plurality of wires 191. The substrate connector 1 and the wire connector 101 may be used in a variety of applications, and thus are used in a variety of equipment, such as a variety of electronic equipment, household equipment, medical equipment, industrial equipment, transport equipment, and the like, however, for convenience of description, are described here as being used in water heaters, stoves, flush toilets, motorcycles, etc.

As illustrated in FIG. 1, the plurality of the wires 191 are arrayed dual file so as to form two rows extending in the lengthwise direction (Y axis direction) of the substrate connector 1, and then connected to the wire connector 101. In the example illustrated in the figure, there are 20 of the wires 191 in each row, for a total of 40 wires, however there can be any number of wires. Note that the substrate connector 1 is a so-called straight type connector and is mounted in an erect fashion, that is, open facing upward (z-axis positive direction) with respect to the substrate 91. The wire connector 101 is fitted vertically into the substrate connector 1, so that the wire 191 is drawn out in a direction perpendicular (z-axis direction) to the substrate 91.

Note that expressions indicating directions, such as up, down, left, right, front, back, and the like, used in the present embodiment to describe the configuration and operation of each portion of the substrate connector 1 and the wire connector 101, are relative and not absolute, and thus suitable for cases where the substrate connector 1 and the wire connector 101 are in the attitudes illustrated in the figures, but should be interpreted differently when the attitudes of the substrate connector 1 and the wire connector 101 change to reflect said changes.

The wire connector 101 is formed integrally using an insulating material made of synthetic resin, and the like, and has a counterpart housing 111 that fits in the substrate connector 1, and a retainer 121 for reliably pressing a counterpart terminal 151 connected to the wire 191 into the counterpart housing 111. Furthermore, the retainer 121 also has the effect of preventing the counterpart terminal 151 from being pulled out after the counterpart terminal 151 has been inserted into the counterpart housing 111. Furthermore, the counterpart housing 111 is a substantially rectangular box-like member extending in a width direction of the substrate connector 1, where the lower (z axis negative direction) side thereof is a fitting portion 113 that fits into a fitting concave portion 13 of the substrate connector 1. A guide convex portion 113a, inserted in and guided by a guide groove portion 13a of the fitting concave portion 13 is formed on both lengthwise direction (Y axis direction) ends of the fitting portion 113. The fitting concave portion 13 and the guide convex portion 113a may also be formed in different positions than the positions illustrated in FIG. 2. This is to prevent erroneous fitting by making it possible to identify a housing and a counterpart housing that fit together in cases where there are several connectors that could fit. Furthermore, the counterpart 111 has a plurality of terminal housing holes 115 for housing the counterpart terminal 151. The terminal housing holes 115 are through holes that penetrate the counterpart housing 111 in the z axis direction from an upper surface 111a of the counterpart housing 111 to a lower surface of the fitting portion 113, and are arrayed so as to form two rows extending in the lengthwise direction (Y axis direction) of the counterpart housing 111. Furthermore, the counterpart terminal 151 connected to the wire 191 is inserted into the terminal housing hole 115 from the upper surface 111a side.

The retainer 121 has a pair of main body frame parts 122 that are separated from one another. The main body frame part 122, as seen looking in the z axis direction, is a member, having a substantially reverse-C shape form, extending in the Y axis direction, and includes a locking arm 124 that serves as a comb shaped locking part extending downward (z axis negative direction). A plurality of the locking arms 124 are arrayed so as to form rows extending in the Y axis direction corresponding to the plurality of terminal housing holes 115 of the counterpart housing 111. Furthermore, after the counterpart terminal 151 connected to the wire 191 is inserted into the terminal housing hole 115, the main body frame part 122 is attached to the counterpart housing 111 so that the locking arm 124 is inserted into the terminal housing hole 115 from the upper surface 111a of the counterpart housing 111. Therefore, because a lower end of the locking arm 124 locks with a locking piece 155 of the counterpart terminal 151, the counterpart terminal 151 is prevented from being pulled out from the terminal housing hole 115. Note that the main body frame part 122 is reliably mounted to the counterpart housing 111 through a locking piece 126 thereof being locked in a locking convex portion 116 formed on a side wall of the counterpart housing 111.

The substrate connector 1 is integrally formed using an insulating material made of synthetic resin, and the like, and has a housing 11 that fits with the wire connector 101, and a terminal 51 made of a metal rod-like member attached so as to penetrate a bottom plate portion 12, to be described later, of the housing 11. The housing 11 is a substantially rectangular box-like member extending in a lengthwise direction of the substrate connector 1, where the upper surface 11a is provided with an open fitting concave portion 13. The fitting concave portion 13 is a part into which the fitting portion 113 of the wire connector 101 fits, and a guide groove portion 13a, into which the guide convex portion 113a of the fitting portion 113 is inserted, is formed on both lengthwise direction (Y axis direction) ends of the fitting concave portion. Note that the terminal 51 includes; a connecting pad on the substrate 91 extending in a transverse direction (x axis direction) of the substrate connector 1 from the bottom plate portion 12, that is, a substrate connecting portion 52 electrically connected by soldering, and the like, to a connecting pad formed on the surface 91a of the substrate 91; and a contact portion 54 extending upward (z axis positive direction) from the bottom plate portion 12 and making contact with the counterpart terminal 151 of the wire connector 101. The contact portions 54 are arrayed in two rows extending in the lengthwise direction of the substrate connector 1 inside the fitting concave portion 13. Furthermore, when the fitting portion 113 of the wire connector 101 is fitted in the fitting concave portion 13 of the substrate connector 1, and, as illustrated in FIG. 1, the wire connector 101 and the substrate connector 1 are fitted together, the contact part 54 of each of the terminals 51 advances into a contact opening 154, which is a contact portion corresponding to the counterpart terminal 151, and makes contact with the counterpart terminal 151.

Next, a detailed description will be given of the configuration of the substrate connector 1.

Figure 3:
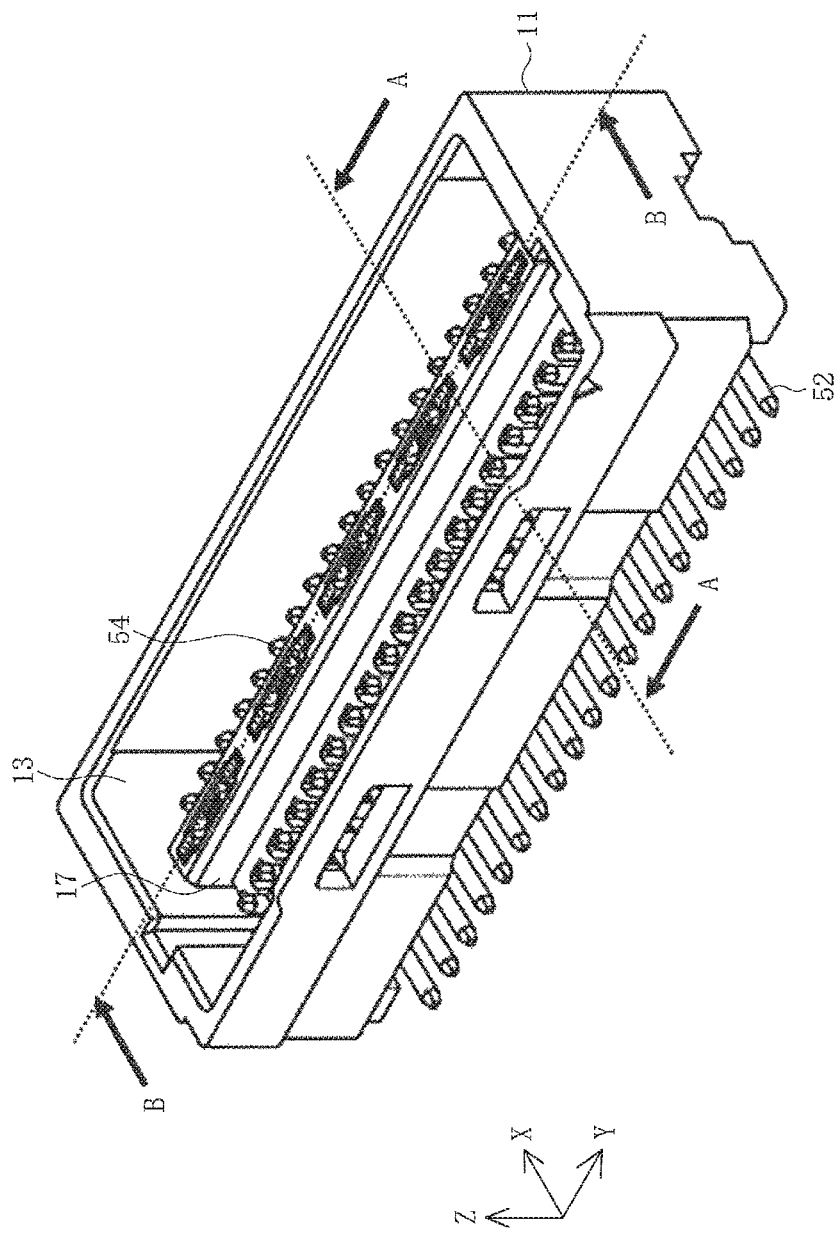
FIG. 3 is a perspective view of the substrate connector in the first embodiment as seen obliquely from above.
Figure 4:
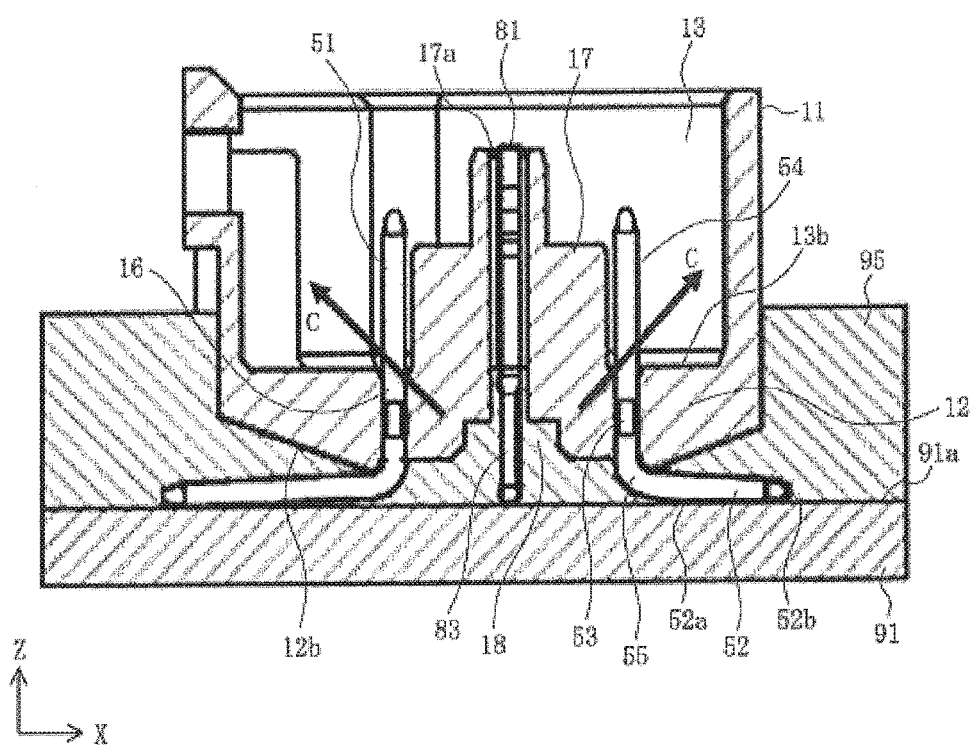
FIG. 4 is a cross sectional view of the substrate connector in the first embodiment that is a cross sectional view as seen along the line indicated by Arrows A-A in FIG. 3.
Figure 5:
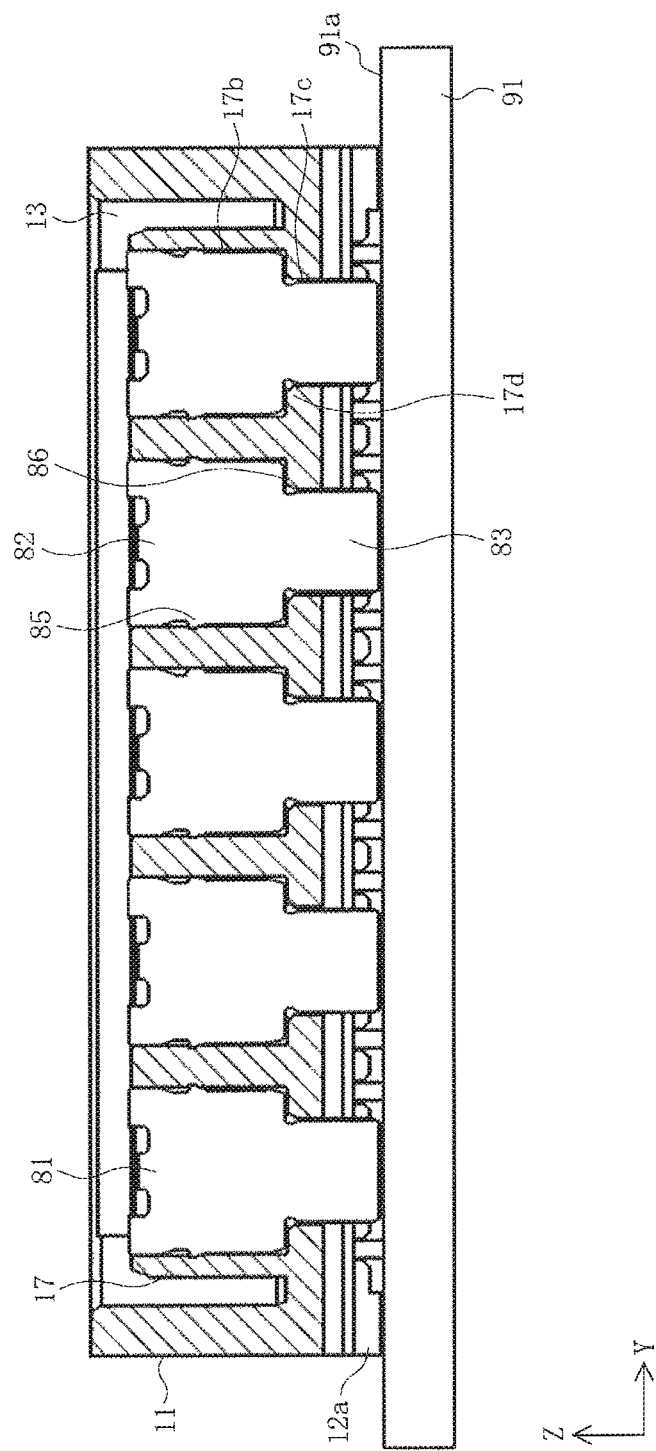
FIG. 5 is a cross sectional view of the substrate connector in the first embodiment that is a cross sectional view as seen along the line indicated by Arrows B-B in FIG. 3.
Figure 6:
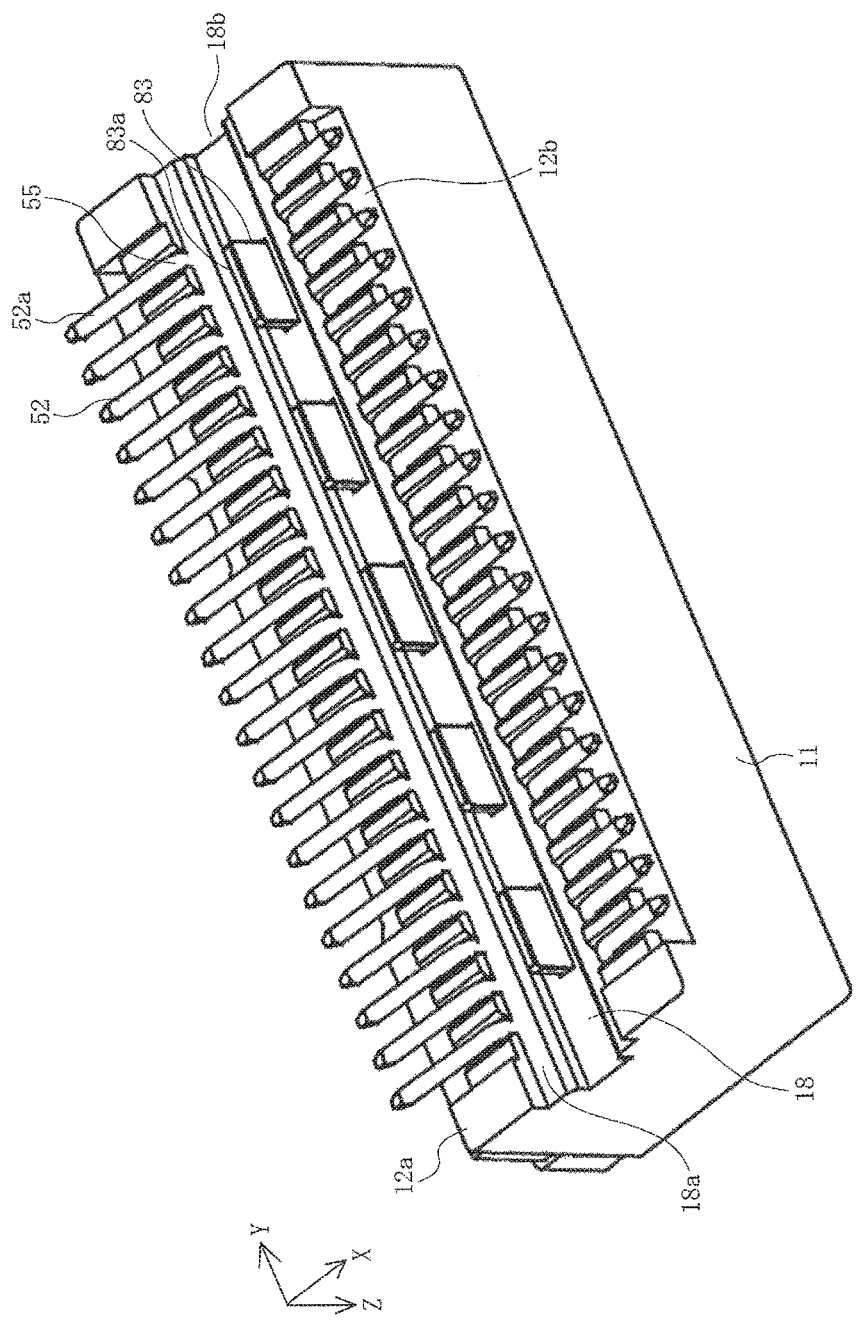
FIG. 6 is a perspective view of the substrate connector in the first embodiment as seen obliquely from below.
Figure 7:
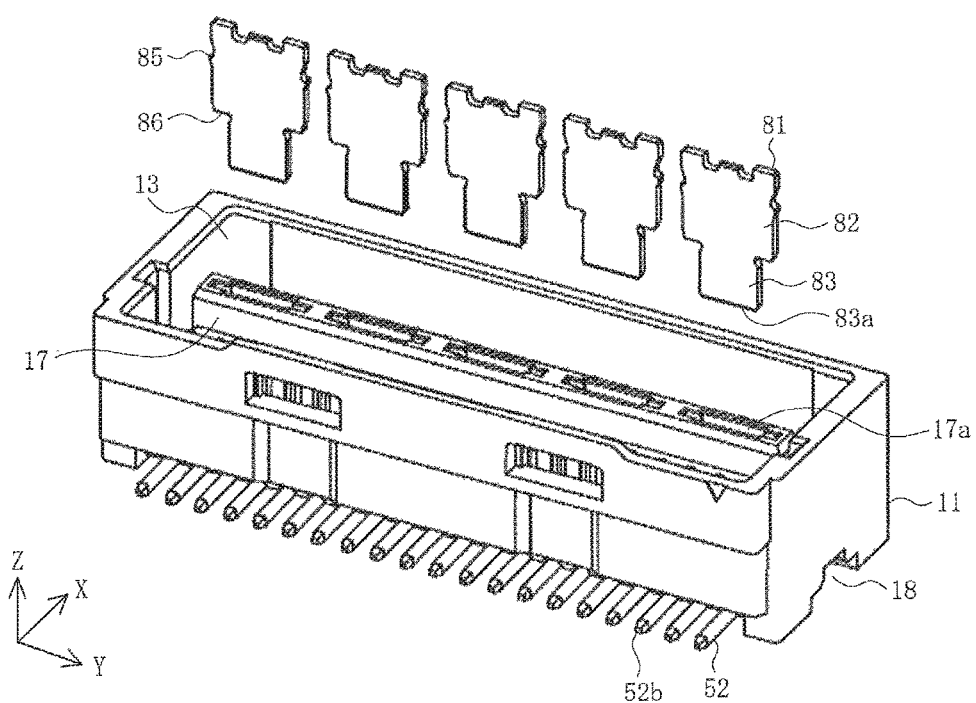
FIG. 7 is a view illustrating a state where nails of the substrate connector in the first embodiment have been removed.

FIG. 3 is a perspective view of the substrate connector in the first embodiment as seen obliquely from above, FIG. 4 is a cross sectional view of the substrate connector in the first embodiment that is a cross sectional view as seen along the line indicated by Arrows A-A in FIG. 3, FIG. 5 is a cross sectional view of the substrate connector in the first embodiment that is a cross sectional view as seen along the line indicated by Arrows B-B in FIG. 3, FIG. 6 is a perspective view of the substrate connector in the first embodiment as seen obliquely from below, and FIG. 7 is a view illustrating a state where nails of the substrate connector in the first embodiment have been removed.

Note that, for the convenience of description, the substrate 91 is only depicted in FIG. 4 and FIG. 5, and a filler 95 is only depicted in FIG. 4.

The inside of the fitting concave portion 13 of the housing 11 is divided substantially in half in a transverse direction by a nail press fitting portion 17 serving as the reinforcing bracket retaining portion. The nail press fitting portion 17 extends upward (z axis positive direction) from a bottom surface 13b of the fitting concave portion 13, and, is a wall-like member extending in the lengthwise direction (Y axis direction) of the housing 11, where the contact portions 54 of the terminal 51 extending in a fitting direction (z axis direction) of the wire connector 101 are arrayed so as to form a row along both x axis direction side surfaces of the nail press fitting portion 17. A plurality of holes 17a are formed aligned in the nail press fitting portion 17 aligned in the Y axis direction forming a row, and one nail 81 is press fitted and retained in each of the holes 17a as a reinforcing bracket. In the example illustrated in the figure, the number of the nails 81 and the holes 17a is five, however, there can be any number of nails and holes.

As illustrated in FIG. 7, the nail 81 is a plate-like member formed by applying a punching process to a metal plate having a substantially rectangular main body portion 82, and a substantially rectangular leg portion 83 extending downward from a lower edge of the main body portion 82. A lower edge 83a of the leg portion 83 functions as a substrate securing portion, and is secured by soldering, and the like, to a connecting pad on the substrate 91, that is, to a connecting pad not illustrated in the figures formed on the surface 91a of the substrate 91. Furthermore, the leg portion 83 has a smaller dimension in a width direction (Y axis direction) than the main body portion 82 does, and thus a cover portion 86 is formed as a stepped portion at a connecting part between the leg portion 83 and the main body portion 82. Additionally, a locking projection 85 is formed on both sides of the main body portion 82 in the width direction thereof.

The hole 17a is a through hole that penetrates from the an upper surface of the nail press fitting portion 17 to a lower surface 12b of the bottom plate portion 12 of the housing 11 and includes; an upper portion 17b in which the main body portion 82 of the nail 81 is housed; a lower portion 17c, connected to a lower edge of the upper portion 17b, having a smaller width dimension in the width direction (Y axis direction) than the upper portion 17b; and a receiving portion 17d formed as a stepped portion at a connecting part between the upper portion 17b and the lower portion 17c. Furthermore, in a state where the nail 81 is press-fitted and retained in the hole 17a, as illustrated in FIG. 5, the main body portion 82 is almost entirely housed inside the upper portion 17b, the leg portion 83 is partially housed in the lower portion 17c, the lower edge 83a, and the vicinity thereof, is exposed below the lower surface 12b of the bottom plate part 12, the cover portion 86 comes close to, or abuts, a receiving portion 17d, and the locking protrusion 85 bites into and is locked to an inner wall of the upper portion 17b. Note that in a state where the substrate connector 1 is mounted on the surface 91a of the substrate 91, the lower surface 12b of the bottom plate portion 12 faces the surface 91a of the substrate 91, and the lower edge 83a of the leg portion 83 of the nail 81 comes close to, or abuts, a connecting pad not illustrated in the figure formed on the surface 91a of the substrate 91, and is then connected and secured to the connecting pad by soldering, and the like. When the lower edge 83a is secured to the surface 91a of the substrate 91 in this way, the cover portion 86 comes close to, or abuts, the receiving portion 17d, and thus, the housing 11 is secured to the surface 91a of the substrate 91, such that the housing does not displace upward (z axis positive direction) and become separated from the substrate 91.

A terminal press fitting hole 16, which penetrates from the bottom surface 13b of the fitting concave portion 13 to the lower surface 12b of the bottom plate portion 12, is formed in the bottom plate portion 12 of the housing 11. The terminal press fitting holes 16 are arranged so as to form a row along both x axis direction side surfaces of the nail press fitting portion 17.

The terminal 51 is a rod-like member formed by applying punching, cutting, or bending, and the like, to a metal material, and, as illustrated in FIG. 4, has a substantially mountain-like shape when the metal rod-like member is viewed in the Y axis direction. Furthermore, the terminal 51 has a retaining portion 53 that is press fitted and retained inside the terminal press fitting hole 16, the contact portion 54 extending linearly upward from an upper edge of the retaining portion 53, and the substrate connecting portion 52 connected to a lower edge of the retaining portion 53 through a bent portion 55. The bent portion 55 is a part that is bent at nearly a right angle and is thus nearly orthogonal to the contact portion 54 and the substrate connection portion 52 in an x-z plain. The substrate connecting portion 52 is arranged so that a tip 52b thereof faces outward in the transverse direction (x axis direction) of the housing 11, and so that a lower surface 52a thereof is nearly parallel to the surface 91a of the substrate 91. Furthermore, in the state where the substrate connector 1 is mounted on the surface 91a of the substrate 91, the lower surface 52a of the substrate connecting portion 52 comes close to, or abuts, a connecting pad not illustrated in the figures formed on the surface 91a of the substrate 91 across the entire extent of the substrate connecting portion 52, and is then secured and electrically connected to the connecting pad by soldering, and the like. A wire not illustrated in the figures is connected to each connecting pad, therefore, each terminal 51 is electrically connected to a corresponding wire of the substrate 91.

Therefore, in each row of the terminals 51 arrayed so as to extend in the lengthwise direction of the housing 11, the lower surface 52a—with the substrate connecting portion 52 in a posture facing outward in the transverse direction of the housing 11 from the bent portion 55 near the center in the transverse direction of the housing 11—is connected to the surface 91a of the substrate 91 using solder, and the like, and the lower edge 83a of the nail 81 positioned between each of the rows of the terminals 51 is connected to the surface 91a of the substrate 91 using solder, and the like. Accordingly, even if vibrations, shocks, thermal stress, and the like, are applied to the substrate connector 1, the connections between the surface 91a of the substrate 91, and the substrate connecting portion 52 and the nail 81 of the terminal 51 will not be broken, and thus, the substrate connector 1 will not be removed from the substrate 91.

Furthermore, because the lower edge 83a of the nail 81 is connected to the surface 91a of the substrate 91 positioned close to the bent portion 55 positioned near the center in the transverse direction of the housing 11, cracks can be prevented from generating in joint material, such as solder, and the like, especially between the lower surface 52a positioned close to the bent portion 55 in the substrate connecting portion 52 of the terminal 51 and the connecting pad on the surface 91a of the substrate 91. Therefore, because cracks are not generated in joint material, such as solder, and the like, between the lower surface 52a of the substrate connecting portion 52 and the connecting pad on the surface 91a of the substrate 91, an electrically connected state between the substrate connecting portion 52 and the connecting pad on the surface 91a of the substrate 91 is maintained.

As illustrated in FIG. 6, a bottom concave portion 18, which is a groove-shaped concave portion extending in the lengthwise direction of the housing 11, is formed in a lower surface of the housing 11, that is, in the lower surface 12b of the bottom plate portion 12, in a position corresponding to the nail 81. A lower surface (bottom surface) of the bottom concave portion 18 is positioned higher than the entirety of the lower surface 12b of the bottom plate portion 12, that is, positioned in the z axis positive direction. Furthermore, a terminal retaining stepped portion 18a is positioned more in the z axis positive direction than the lower surface of the bottom concave portion 18 on both sides of the bottom concave portion 18. Note that the bottom concave portion 18 is, through an opening 18b thereof, open in a side wall on both lengthwise ends of the housing 11. Furthermore, the lower edge of the hole 17a is open, and the leg portion 83 of the nail 81 is exposed, in the lower surface of the bottom concave portion 18, while the lower edge of the terminal press fitting hole 16 is open, and the bent portion 55 of the terminal 51 is exposed, in the terminal retaining stepped portion 18a. Moreover, a bottom plate leg portion 12a is formed protruding downward at each of the four corners of the lower surface 12b of the bottom plate portion 12, while the lower surface of the bottom plate leg portion 12a, in a state where the substrate connector 1 is mounted on the surface 91a of the substrate 91, comes close to, or abuts, the surface 91a of the substrate 91, thus stabilizing the posture of the housing 11 with respect to the substrate 91.

By the way, based on the type of equipment using the substrate connector 1 and the wire connector 101, the filler 95 made from an insulating material, such as synthetic resin, and the like, is provided on the surface 91a of the substrate 91 for water proofing purposes, and thus the surface 91a is sometimes covered by the filler 95. Because the filler 95 is provided, in such cases, so that an upper surface thereof is positioned sufficiently higher than the entirety of the lower surface 12b of the bottom plate portion 12, as illustrated in FIG. 4, a space between the bottom plate portion 12 and the surface 91a of the substrate 91 is also filled.

Note that because the filler 95 is made from a two-component urethane, a thermal expansion rate thereof is different from, for example, a thermal expansion rate of the substrate 91 when made from a glass epoxy, and the like, or, for example, a thermal expansion rate of the housing 11 when made from nylon, and the like. When the thermal expansion rate of the filler 95 is different from the thermal expansion rates of the substrate 91 and the housing 11 in this way, the housing 11 is subjected to, for example, the directional force illustrated by the arrow C in FIG. 4 when an environmental temperature changes and the filler 91 expands significantly. Furthermore, when the filler 95 solidifies and expands after filling the space between the bottom plate portion 12 and the surface 91a of the substrate 91, the housing 11 is subjected to the same force. Because this type of force acts on the housing 11 and the substrate connecting portion 52 of the terminal 51, cracks are generated in the joint material, such as solder, and the like, between the lower surface 52a of the substrate connecting portion 52 and the connecting pad on the surface 91a of the substrate 91, especially in the joint material positions close to the bent portion 55.

However, because the lower edge 83a of the nail 81 is connected to the surface 91a of the substrate 91 positioned close to the bent portion 55 positioned near the center in the transverse direction of the housing 11, cracks can be prevented from generating in the joint material between the lower surface 52a of the substrate connecting portion 52 of the terminal 51 and the connecting pad on the surface 91a of the substrate 91, even if acted upon by the force caused by the expansion, and the like, of the filler 95.

Additionally, air bubbles sometimes become mixed in the filler 95 when the filler 95 fills the space between the bottom plate portion 12 and the surface 91a of the substrate 91. When a large volume of bubbles becomes mixed in the filler 95 due to the fact that bubbles expand more than the filler 95 itself does when the environmental temperature changes, the housing 11 is subjected to a very significant amount of force. However, as will be described below, the bottom concave portion 18, which is a groove-like concave portion, is formed in the lower surface 12b of the bottom plate portion 12, and both ends of the bottom concave portion 18 are open in side walls at both lengthwise direction ends of the housing 11 through the openings 18b. Therefore, because the filler 95 flows smoothly inside the bottom concave portion 18 from one of the openings 18b toward the other of the openings 18b when the space between the bottom plate portion 12 and the surface 91a of the substrate 91 is filled, the bubbles mixed in with the filler 95 are discharged in conjunction with the flow of the filler 95, and thus do not remain between the bottom plate portion 12 and the surface 91a of the substrate 91. Accordingly, the housing 11 is thus reliably protected from being subjected to significant force caused by the expansion of bubbles, which thus prevents the generation of cracks in the joint material between the connecting pad on the surface 91a of the substrate 91 and the lower surface 52a of the substrate connecting portion 52 of the terminal 51.

Note that, as illustrated in FIG. 6, because the leg portion 83 of the nail 81 inside the bottom concave portion 18 is a plate-like member extending in the same direction (Y axis direction) the bottom concave portion 18 extends in, the leg portion does not inhibit the flow of the filler 95, and is not subjected to the force generated by the flow of the filler 95. Because the vicinity of the lower edge of the retaining portion 53 of the terminal 51 is also covered by the terminal retaining stepped portion 18a, the vicinity thereof is not subjected to the force caused by the flow of the filler 95.

Therefore, in the present embodiment, the connector 1 is provided with the terminal 51, the housing 11 for retaining the terminal 51, and the nail 81 retained in the housing 11, where the housing 11 includes the fitting concave portion 13 that fits with the wire connector 101 and the bottom plate portion 12 with a lower surface 12b that faces the surface 91a of the substrate 91, the terminal 51 includes the contact portion 54 that makes contact with the counterpart terminal 151 of the wire connector inside 101 inside the fitting concave portion 13 and the substrate connecting portion 52 exposed from the lower surface 12b of the bottom plate portion 12 and connected to the connecting pad on the surface 91a of the substrate 91, and the nail 81 includes the main body portion 82 retained in the housing 11 inside the fitting concave portion 13 and the leg portion 83 exposed from the lower surface 12b of the bottom plate portion 12 and connected to the connecting pad on the surface 91a of the substrate 91.

Therefore, because the nail 81 is close to the terminal 51, the substrate connector 1, despite being small and having a simple configuration, is able to reliably maintain the connection between the substrate connecting portion 52 of the terminal 51 and the connecting pad on the surface 91a of the substrate 91.

Furthermore, the terminal 51 includes the bent portion 55 linked to the substrate connecting portion 52, the lower surface 52a of the substrate connecting portion 52 is substantially parallel to the surface 91a of the substrate 91, the tip 52b thereof extends so as to face outward in the transverse direction of the housing 11, and the lower edge 83a of the leg portion 83 of the nail 81 is connected to the connecting pad on the surface 91a of the substrate 91 in a position close to the bent portion 55 of the terminal 51. Accordingly, the connection between the substrate connecting portion 52 and the connecting pad on the surface 91a of the substrate 91 is reliably sustained without cracks generating in the joint material, such as solder, and the like, between the lower surface 52a, positioned close to the bent portion 55 in the substrate connecting portion 52 of the terminal 51, and the connecting pad on the surface 91a of the substrate 91.

Additionally, the housing 11 includes the nail press fitting portion 17 that retains the nail 81 inside the fitting concave portion 13, and the contact portion 54 of the terminal 51 extends in a fitting direction with respect to the wire connector 101 along a side surface of the nail press fitting portion 17. Additionally, there are a plurality of the terminals 51, the contact portions 54 are arrayed so as to form a row along both side surfaces of the nail press fitting portion 17, the substrate connecting portions 52 are arrayed so as to form two rows in the lower surface 12b of the bottom plate portion 12, and the leg portion 83 of the nail 81 is positioned between the rows of the substrate connecting portions 52. Accordingly, the connection between the substrate connecting portion 52 and the surface 91a of the substrate 91 is reliably sustained.

Additionally, the filler 95 fills the space between the bottom plate portion 12 and the substrate 91. Furthermore, the bottom concave portion 18 extending in the lengthwise direction of the housing 11 and having the opening 18b on both ends is formed on the lower surface 12b of the bottom plate portion 12. Accordingly, because the filler 95 fills in smoothly and mixed in bubbles are discharged, the bottom plate portion 12 is not subjected to significant amounts of force, and the connection between the substrate connecting portion 52 of the terminal 51 and the connecting pad on the surface 91a of the substrate 91 can be reliably sustained.

A second embodiment will be described next. Note that the description omits descriptions of those items having the same structure as in the first embodiment and assigns said items the same reference numbers. Descriptions of operations and effects that are same as in the first embodiment will be also omitted.

Figure 8:
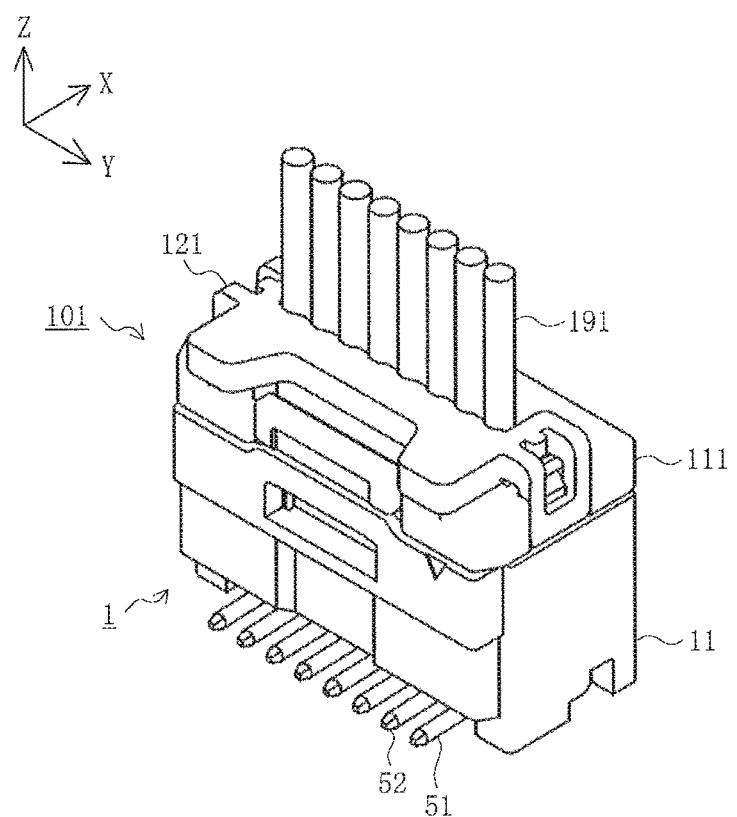
FIG. 8 is a perspective view illustrating a state where a substrate connector is fitted with a wire connector in a second embodiment.
Figure 9:
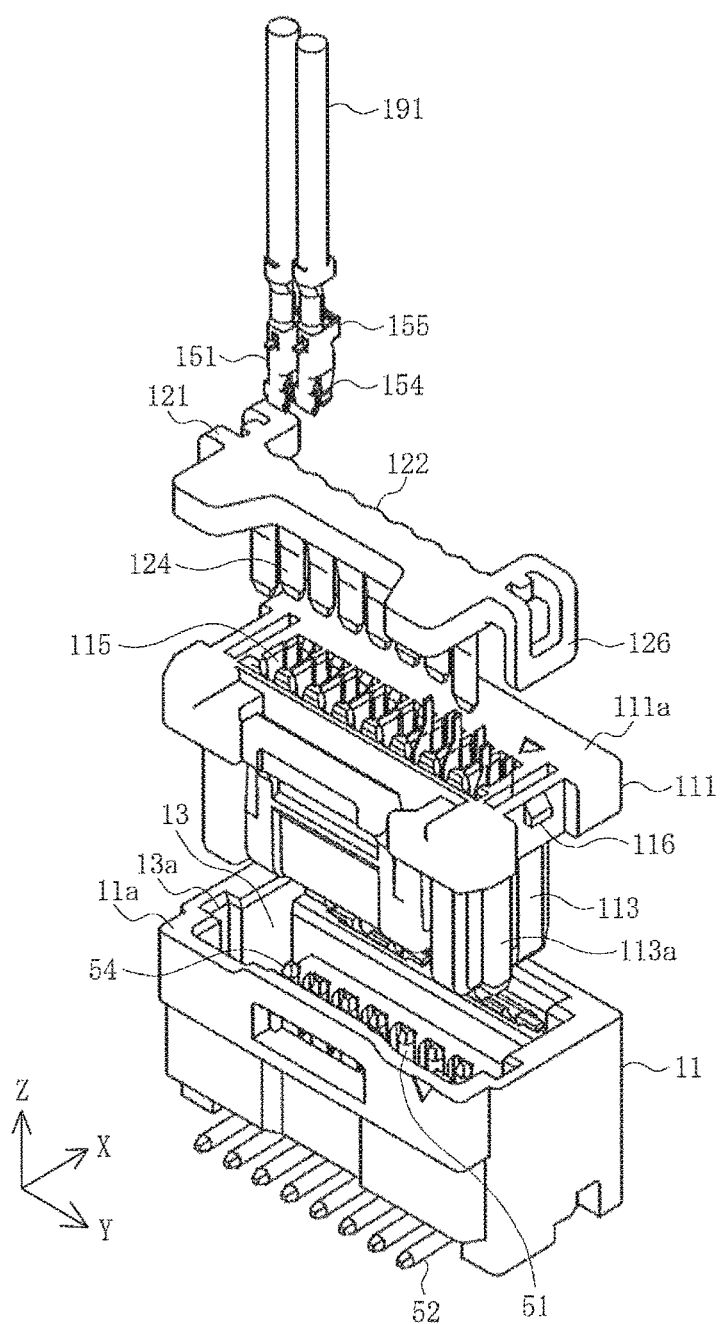
FIG. 9 is an exploded view of the wire connector in a state prior to being fitted with the substrate connector in the second embodiment.

FIG. 8 is a perspective view illustrating a state where a substrate connector is fitted with a wire connector in a second embodiment, and FIG. 9 is an exploded view of the wire connector in a state prior to being fitted with the substrate connector in the second embodiment.

In the present embodiment, the plurality of the wires 191 are arrayed single file so as to form one row extending in the lengthwise direction (Y axis direction) of the substrate connector 1, and are then connected to the wire connector 101. In the example illustrated in the figure, there are 8 of the wires 191, however there can be any number of wires. Furthermore, the terminal housing holes 115 of the counterpart housing 111 are arrayed so as to form one row extending in the lengthwise direction (Y axis direction) of the counterpart housing 111. Furthermore, the retainer 121 has a single main body frame portion 122. Note that the contact portions 54 of the terminals 51 of the substrate connector 1 are arrayed in one row extending in the lengthwise direction of the substrate connector 1 inside the fitting concave portion 13.

Because the other points of the configuration of the wire connector 101 in the present embodiment are the same as in the first embodiment, descriptions thereof are omitted.

Next, the configuration of the substrate connector 1 in the present embodiment will be described in detail.

Figure 10:
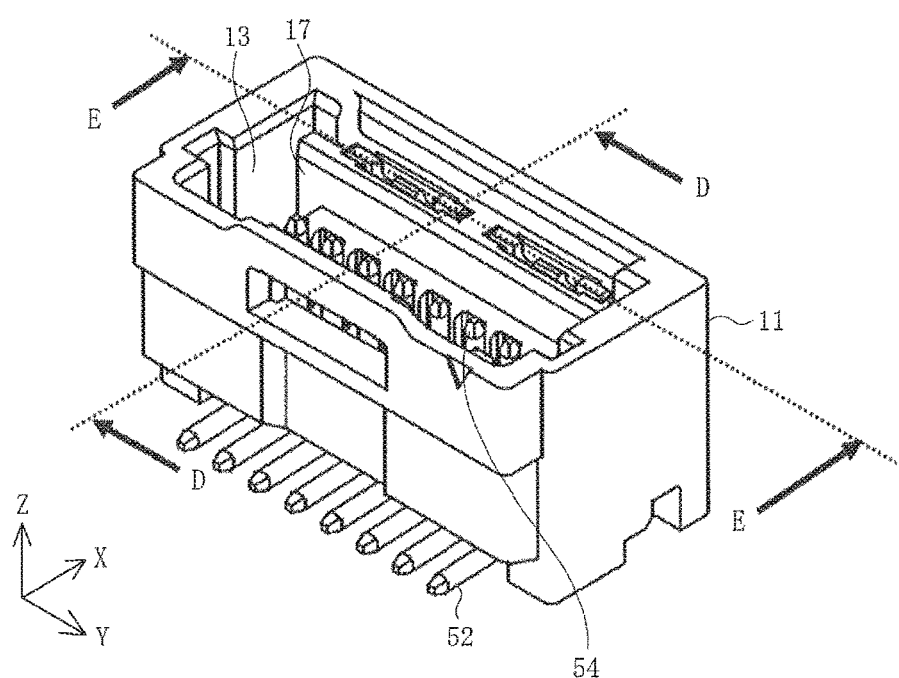
FIG. 10 is a perspective view of the substrate connector in the second embodiment as seen obliquely from above.
Figure 11:
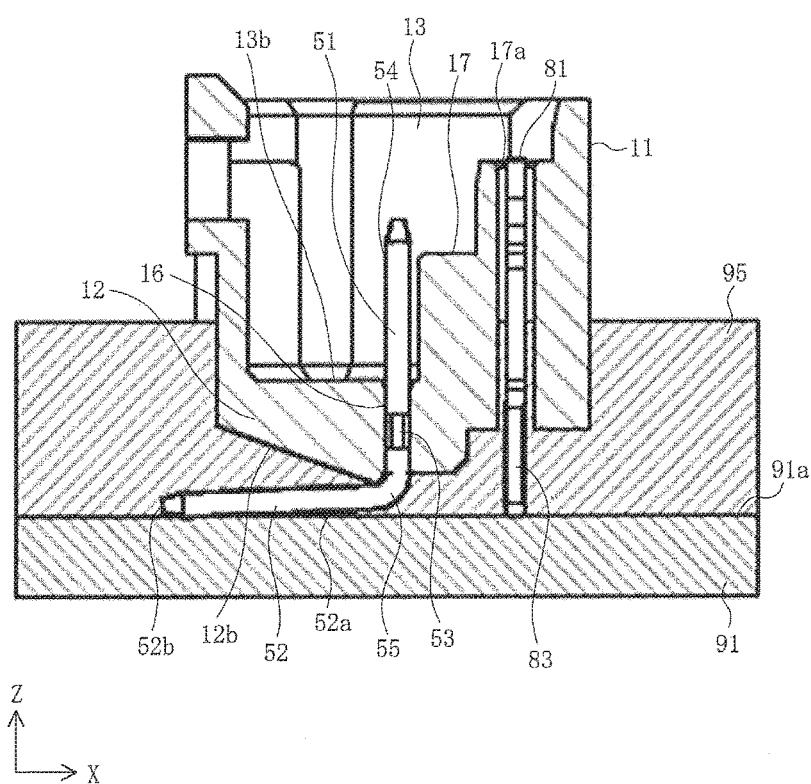
FIG. 11 is a cross sectional view of the substrate connector in the second embodiment that is a cross sectional view as seen along the line indicated by Arrows D-D in FIG. 10.
Figure 12:
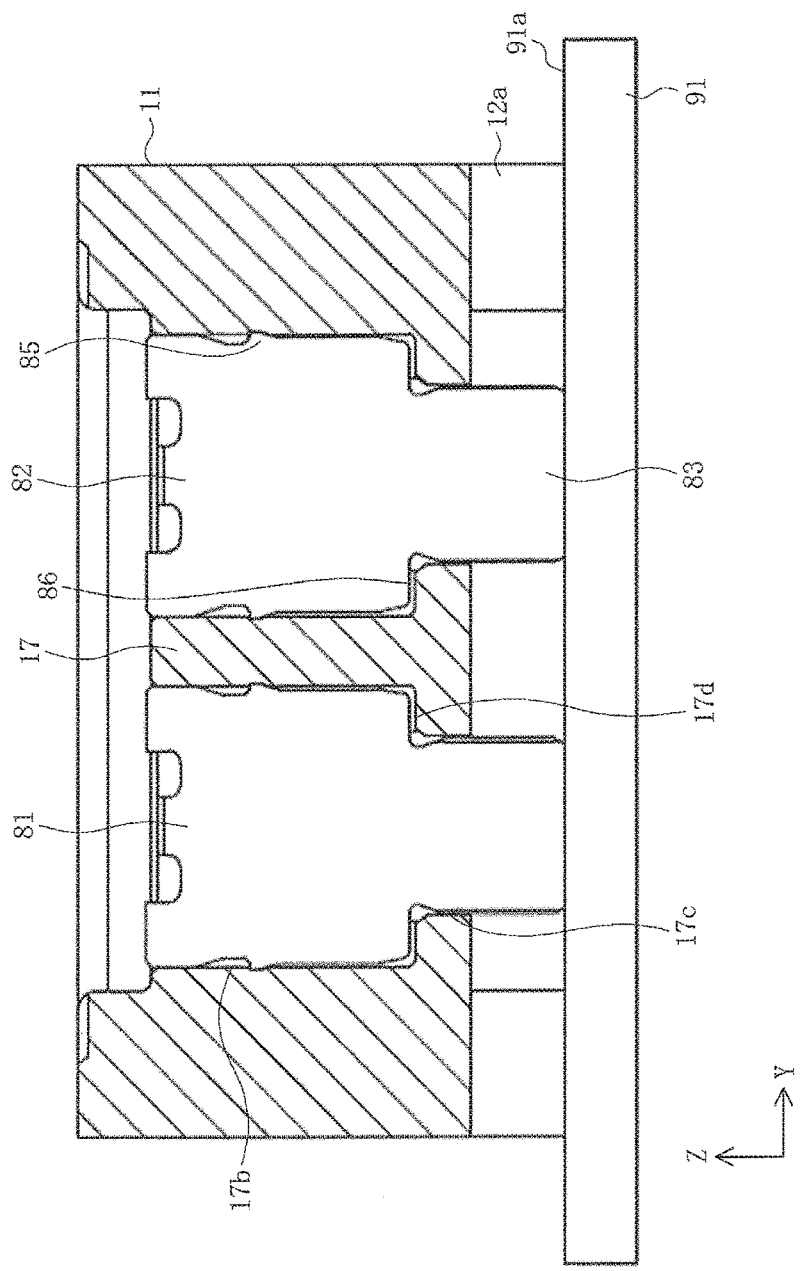
FIG. 12 is a cross sectional view of the substrate connector in the second embodiment that is a cross sectional view as seen along the line indicated by Arrows E-E in FIG. 10.
Figure 13:
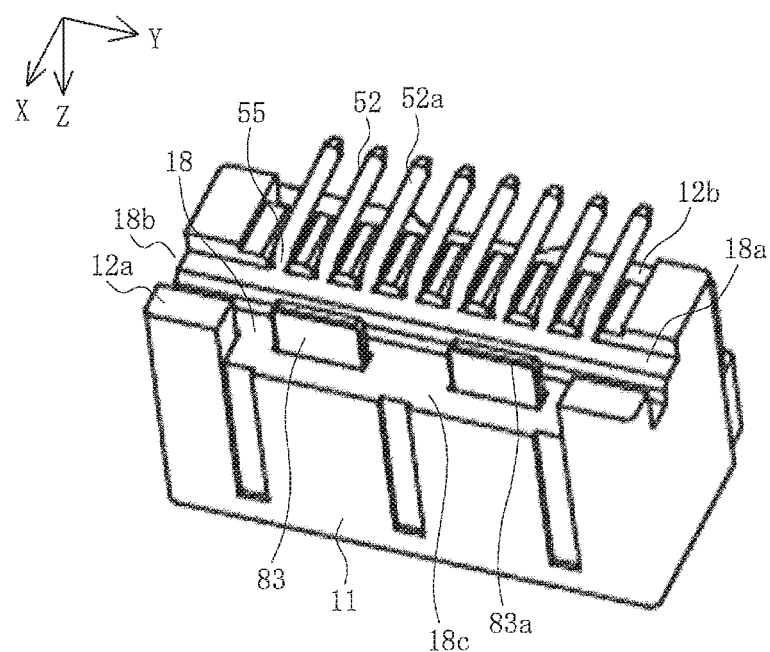
FIG. 13 is a perspective view of the substrate connector in the second embodiment as seen obliquely from above.
Figure 14:
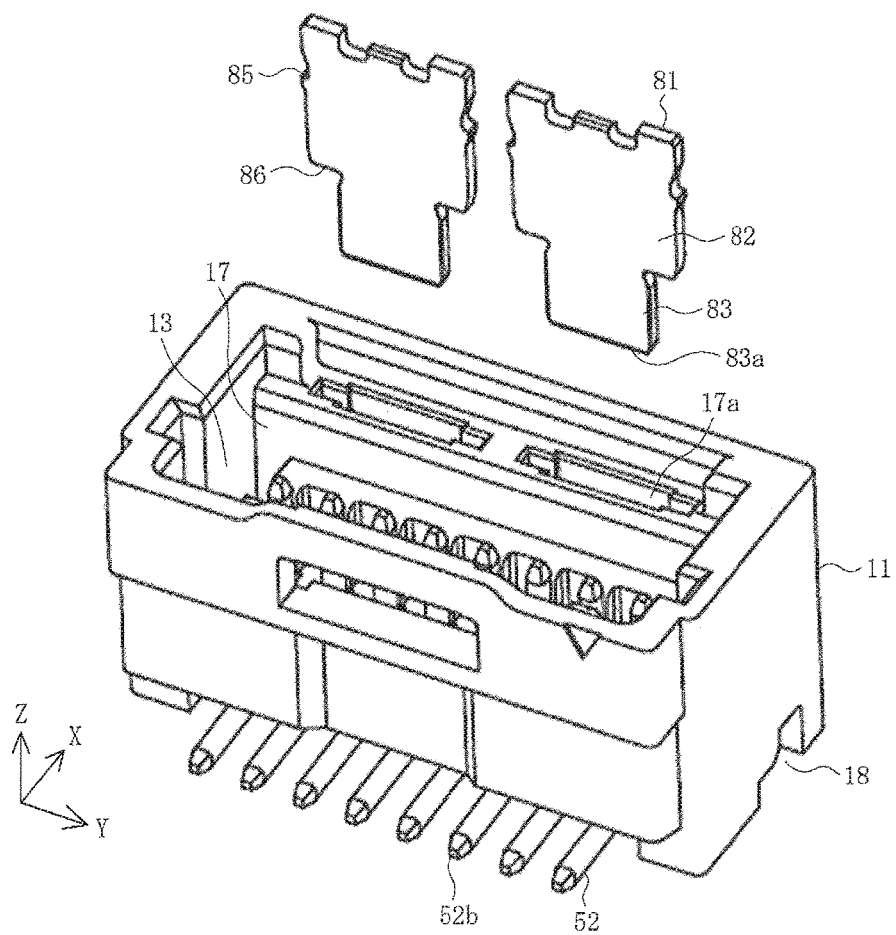
FIG. 14 is a view illustrating a state where nails of the substrate connector in the second embodiment have been removed.
Figure 15:
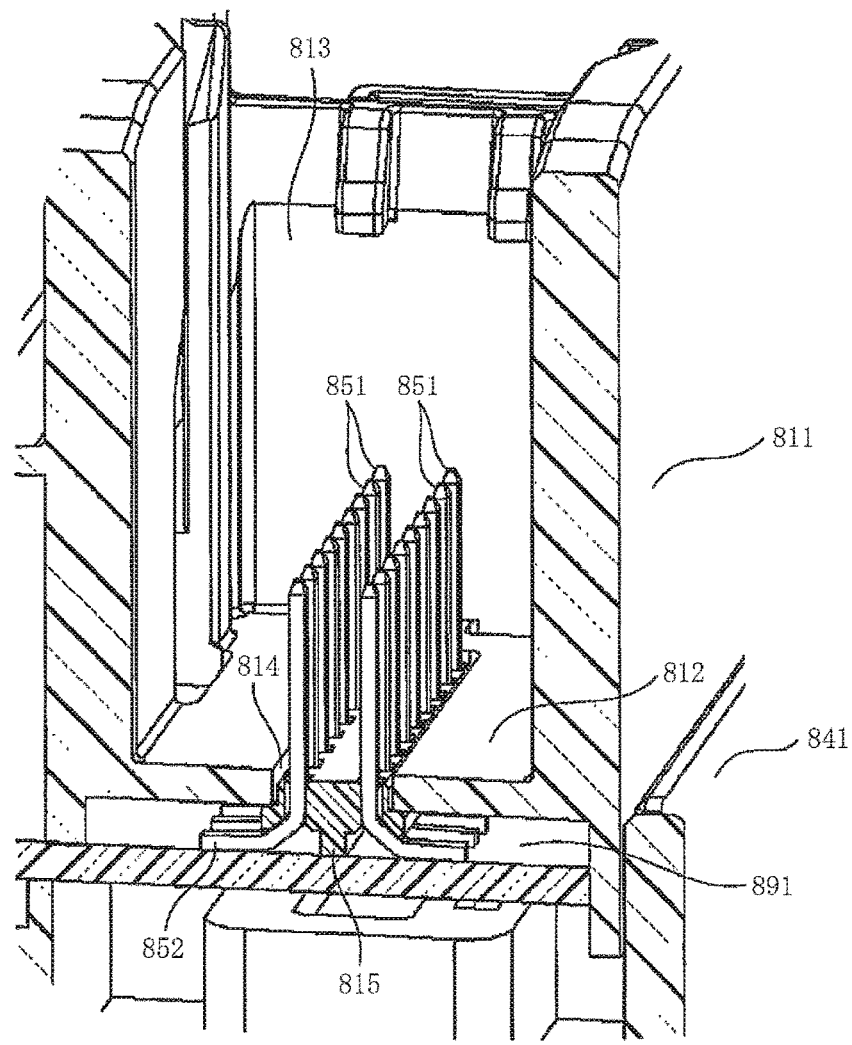
FIG. 15 is a perspective view illustrating a conventional connector.

FIG. 10 is a perspective view of the substrate connector in the second embodiment as seen obliquely from above, FIG. 11 is a cross sectional view of the substrate connector in the second embodiment that is a cross sectional view as seen along the line indicated by Arrows D-D in FIG. 10, FIG. 12 is a cross sectional view of the substrate connector in the second embodiment that is a cross sectional view as seen along the line indicated by Arrows E-E in FIG. 10, FIG. 13 is a perspective view of the substrate connector in the second embodiment as seen obliquely from below, and FIG. 14 is a view illustrating a state where nails of the substrate connector in the second embodiment have been removed.

Note that, for the convenience of description, the substrate 91 is only depicted in FIG. 11 and FIG. 12, and a filler 95 is only depicted in FIG. 11.

In the present embodiment, the nail press fitting portion 17 is integrally formed with one side wall extending in the lengthwise direction (Y axis direction) in the housing 11, and the fitting concave portion 13 is located between the other side wall and the nail press fitting portion 17 extending in the lengthwise direction. In the example illustrated in the figure, the number of the nails 81 and the holes 17*a* is two, however, there can be any number of nails and holes.

As illustrated in FIG. 11, the substrate connecting portion 52 of the terminal 51 extends from the bent portion 55 positioned near the center of the housing 11 in the transverse direction, and, in a posture where the tip 52*b* thereof faces outward in the transverse direction of the housing 11, the lower surface 52*a* thereof is connected to the surface 91*a* of the substrate 91 using solder, and the like. On the other hand, the leg portion 83 of the nail 81 is positioned between the bent portion 55 and a side wall of the housing 11 with respect to the transverse direction of the housing 11 close to the bent portion 55 of the substrate connecting portion 52 of the terminal 51, and the lower edge 83*a* thereof is connected to the surface 91*a* of the substrate 91 using solder, and the like. Accordingly, even if vibrations, shocks, thermal stress, and the like, are applied to the substrate connector 1, the connections between the surface 91*a* of the substrate 91, and the substrate connecting portion 52 and the nail 81 of the terminal 51 will not be broken, and thus, the substrate connector 1 will not be removed from the substrate 91.

Furthermore, because the lower edge 83*a* of the nail 81 is connected to the surface 91*a* of the substrate 91 positioned close to the bent portion 55 positioned near the center in the transverse direction of the housing 11, cracks can be prevented from generating in joint material, such as solder, and the like, between the lower surface 52*a* positioned close to the bent portion 55 in the substrate connecting portion 52 of the terminal 51 and the connecting pad on the surface 91*a* of the substrate 91. Therefore, because cracks are not generated in joint material, such as solder, and the like, between the lower surface 52*a* of the substrate connecting portion 52 and the connecting pad on the surface 91*a* of the substrate 91, an electrically connected state between the substrate connecting portion 52 and the connecting pad on the surface 91*a* of the substrate 91 is maintained.

As illustrated in FIG. 13, the bottom concave portion 18, which is a groove-shaped concave portion extending in the lengthwise direction of the housing 11, is formed in the lower surface 12*b* of the bottom plate portion 12, in a position corresponding to the nail 81. The lower surface of the bottom concave portion 18 is positioned more in the z axis direction than the entirety of the lower surface 12*b* of the bottom plate portion 12. Furthermore, the terminal retaining stepped portion 18*a* is positioned more in the z axis positive direction than the lower surface of the bottom concave portion 18 on one side of the bottom concave portion 18. Note that the bottom concave portion 18 is not only open, through the openings 18*b* thereof, in both lengthwise ends of the housing 11, but is also open, through a central opening 18*c,* in a side wall on one transverse direction end (side corresponding to the nail 81) of the housing 11.

As was described in the first embodiment, the filler 95 made from an insulating material, such as synthetic resin, and the like, is provided on the surface 91*a* of the substrate 91, and thus the surface 91*a* is sometimes covered by the filler 95. As illustrated in FIG. 11, in such cases, the filler 95 also fills the space between the bottom plate portion 12 and the surface 91*a* of the substrate 91.

In the present embodiment, because the lower edge 83*a* of the nail 81 is connected to the surface 91*a* of the substrate 91 positioned close to the bent portion 55 of the terminal 51, cracks can be prevented from generating in the joint material between the lower surface 52*a* of the substrate connecting portion 52 of the terminal 51 and the connecting pad on the surface 91*a* of the substrate 91, even if acted upon by the force caused by the expansion, and the like, of the filler 95.

Furthermore, the bottom concave portion 18, which is a groove-like concave portion, is formed on the lower surface of the bottom plate portion 12, and not only are both ends of the bottom concave portion 18 open, through the openings 18*b,* in side walls on both lengthwise ends of the housing 11, the portion is open, through the central opening 18*c,* in one side wall in the transverse direction of the housing 11. Therefore, because the filler 95 flows smoothly inside the bottom concave portion 18 from one of the openings 18*b* toward the other of the openings 18*b* and the central opening 18*c* when the space between the bottom plate portion 12 and the surface 91*a* of the substrate 91 is filled, the bubbles mixed in with the filler 95 are discharged in conjunction with the flow of the filler 95, and thus do not remain between the bottom plate portion 12 and the surface 91*a* of the substrate 91. Accordingly, the housing 11 is thus reliably protected from being subjected to significant force caused by the expansion of bubbles, which thus prevents the generation of cracks in the joint material between the connecting pad on the surface 91*a* of the substrate 91 and the lower surface 52*a* of the substrate connecting portion 52 of the terminal 51.

Because the other points of the configuration of the substrate connector 1 in the present embodiment are the same as in the first embodiment, descriptions thereof are omitted.

Note that the present disclosure is only one example, and thus any appropriate change that preserves the gist of the present disclosure and can be conceived by a person skilled in the art is within the scope of the present disclosure. The widths, thicknesses, and shapes of the portions illustrated in the drawing are illustrated schematically and are not intended to limit the interpretation of the present disclosure.

Furthermore, the disclosure of the present specification describes characteristics related to preferred and exemplary embodiments. Various other embodiments, modifications and variations within the scope and spirit of the claims appended hereto could naturally be conceived of by persons skilled in the art by summarizing the disclosures of the present specification.

The present disclosure can be applied to connectors.

The invention claimed is:

1. A connector comprising:
    a terminal;
    a housing for retaining the terminal; and
    a reinforcing bracket retained in the housing,
    wherein the housing includes a fitting concave portion that fits with a counterpart connector and a bottom plate portion that faces a surface of a substrate,
    wherein the terminal includes a contact portion that makes contact with a counterpart terminal of the counterpart connector inside the fitting concave portion and a substrate connecting portion exposed from a lower surface of the bottom plate portion and connected to a connecting pad on the surface of the substrate, and
    wherein the reinforcing bracket includes a main body portion sustained in the housing inside the fitting concave portion and a leg portion exposed from the lower surface of the bottom plate portion and connected to the connecting pad on the surface of the substrate.

2. The connector according to claim 1, wherein the terminal includes a bent portion linked to the substrate connecting portion, a lower surface of the substrate connecting portion is substantially parallel to the surface of the substrate, and wherein a tip thereof extends so as to face outward in a short direction of the housing, and a lower edge of the leg portion of the reinforcing bracket is connected to the connecting pad on the surface of the substrate in a position close to the bent portion of the terminal.

3. The connector according to claim 1, wherein the housing includes a reinforcing bracket retaining portion for retaining the reinforcing bracket inside the fitting concave portion, and the contact portion of the terminal extends in a fitting direction with respect to the counterpart connector along a side surface of the reinforcing bracket retaining portion.

4. The connector according to claim 3, wherein there is a plurality of the terminals, the contact portions are arrayed so as to form rows along each of both side surfaces of the reinforcing bracket retaining portion, the substrate connection portions are arrayed so as to form two rows on a lower surface of the bottom plate portion, and the leg portion of the reinforcing bracket is positioned between the rows of the substrate connecting portions.

5. The connector according to claim 1, wherein a filler fills a space between the bottom plate portion and a substrate.

6. The connector according to claim 5, wherein a groove shaped concave portion, extending in a lengthwise direction of the housing and having an opening on each end, is formed on the lower surface of the bottom plate portion.

\* \* \* \* \*